United States Patent
Farquhar et al.

(10) Patent No.: US 8,350,470 B2
(45) Date of Patent: Jan. 8, 2013

(54) ENCAPSULATION STRUCTURES OF ORGANIC ELECTROLUMINESCENCE DEVICES

(75) Inventors: Donald Seton Farquhar, Niskayuna, NY (US); Ahmet Gun Erlat, Clifton Park, NY (US); Christian Maria Anton Heller, Albany, NY (US); Anil Raj Duggal, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 217 days.

(21) Appl. No.: 12/336,683

(22) Filed: Dec. 17, 2008

(65) Prior Publication Data

US 2010/0148661 A1    Jun. 17, 2010

(51) Int. Cl.
   *H01J 1/62*    (2006.01)
   *H01J 63/04*   (2006.01)

(52) U.S. Cl. ........ 313/512; 313/498; 313/504; 313/506; 313/292

(58) Field of Classification Search .......... 313/498–512, 313/609, 292
   See application file for complete search history.

(56) References Cited

U.S. PATENT DOCUMENTS

| | | |
|---|---|---|
| 5,693,956 A | 12/1997 | Shi et al. |
| 5,882,761 A | 3/1999 | Kawami et al. |
| 6,268,695 B1 | 7/2001 | Affinito |
| 6,465,953 B1 | 10/2002 | Duggal |
| 6,692,610 B2 | 2/2004 | Low et al. |
| 6,724,143 B2 | 4/2004 | Chen et al. |
| 6,949,389 B2 | 9/2005 | Pichler et al. |
| 7,015,640 B2 | 3/2006 | Schaepkens et al. |
| 7,033,850 B2 | 4/2006 | Tyan et al. |
| 7,205,718 B2 | 4/2007 | Cok |
| 7,225,823 B1 | 6/2007 | Ransom et al. |
| 7,256,543 B2 | 8/2007 | Su et al. |
| 7,541,671 B2 | 6/2009 | Foust et al. |
| 2004/0104673 A1* | 6/2004 | Hosokawa et al. ........... 313/512 |
| 2004/0247949 A1* | 12/2004 | Akedo et al. .................. 428/704 |
| 2005/0023974 A1* | 2/2005 | Chwang et al. ............... 313/512 |
| 2006/0003474 A1 | 1/2006 | Tyan et al. |
| 2006/0093795 A1* | 5/2006 | Wang et al. ................. 428/195.1 |

(Continued)

FOREIGN PATENT DOCUMENTS

GB    2416621 A    2/2006

(Continued)

OTHER PUBLICATIONS

PCT International Search Report dated Oct. 28, 2010.

(Continued)

*Primary Examiner* — Toan Ton
*Assistant Examiner* — Kevin Quarterman
(74) *Attorney, Agent, or Firm* — Mary Louise Stanford

(57) ABSTRACT

An encapsulation structure comprises a first barrier layer, and an electroluminescence device configured to be coupled to the first barrier layer and comprising a substrate and an electroluminescence element both defining a lateral side. The electroluminescence element comprises a first electrode disposed on the substrate, a second electrode, and an organic light-emitting layer disposed between the first and second electrodes. Further, the encapsulation structure comprises a second barrier layer configured to be coupled to the electroluminescence device, and an adhesive configured to locate between and connect the first and second barrier layers, and at least to be coupled to the lateral side of the electroluminescence device to seal the electroluminescence device between the first and second barrier layers. An encapsulation method is also presented.

15 Claims, 3 Drawing Sheets

U.S. PATENT DOCUMENTS

| | | |
|---|---|---|
| 2006/0125383 A1* | 6/2006 | Liu et al. .................. 313/504 |
| 2006/0152136 A1* | 7/2006 | Fujikake et al. ............ 313/503 |
| 2007/0049155 A1* | 3/2007 | Moro et al. .................. 445/24 |
| 2007/0132381 A1* | 6/2007 | Hayashi et al. ............. 313/512 |
| 2007/0281089 A1 | 12/2007 | Heller et al. |
| 2008/0084150 A1* | 4/2008 | Cok .............................. 313/110 |
| 2008/0231180 A1 | 9/2008 | Waffenschmidt et al. |
| 2008/0241471 A1 | 10/2008 | Itai |
| 2008/0303418 A1* | 12/2008 | Fujita et al. ................ 313/504 |

FOREIGN PATENT DOCUMENTS

| | | |
|---|---|---|
| WO | WO2008012460 A2 | 1/2008 |

OTHER PUBLICATIONS

PCT International Search Report dated Nov. 29, 2010 and Written Opinion.

\* cited by examiner

ENCAPSULATION STRUCTURES OF ORGANIC ELECTROLUMINESCENCE DEVICES

BACKGROUND

This invention relates generally to encapsulation structures and methods of organic electroluminescence devices. More particularly, this invention relates to the encapsulation structures and methods of the organic electroluminescence devices being resistant to moisture and/or oxygen.

Organic light emitting devices (OLEDs) generally comprise multiple thin film layers formed on a substrate such as glass or silicon. A light-emitting layer of a luminescent organic solid, as well as optional adjacent semiconductor layers, is sandwiched between a cathode and an anode. The semiconductor layers may be hole-injecting or electron-injecting layers. The light-emitting layer may be selected from any of a multitude of fluorescent or phosphorescent organic solids and may comprise multiple sublayers or a single blended layer.

When a potential difference is applied across the anode and cathode, electrons move from the cathode to the optional electron-injecting layer and finally into the layer(s) of organic material. At the same time, holes move from the anode to the optional hole-injecting layer and finally into the same organic light-emitting layer(s). When the holes and electrons meet in the layer(s) of organic material, they combine and produce photons. The wavelength of the photons depends on the material properties of the organic material in which the photons are generated, and the color of light emitted from the OLED can be controlled by the selection of the organic material, or by the selection of dopants, or by other techniques known in the art.

In a typical OLED, either the anode or the cathode is transparent in order to allow the emitted light to pass through. If it is desirable to allow light to be emitted from both sides of the OLED, both the anode and cathode can be transparent.

The OLEDs have a number of beneficial characteristics, such as a low activation voltage, quick response, high brightness, high visibility, and uncomplicated process of fabrication. Thus, the OLEDs represent a promising technology for display applications and for general illumination.

However, although substantial progresses have been made in the development of the OLEDs to date, additional challenges still remain. For example, the OLEDs continue to face challenges associated with their long-term stability. One of the challenges limiting the widespread use of the OLEDs has been the fact that the organic polymers or small molecule materials making up the device as well as, in some cases, the electrodes, are environmentally sensitive. In particular, it is well known that device performance degrades in the presence of moisture and/or oxygen.

Therefore, there is a need for a new and improved encapsulation structure and method of the OLEDs.

BRIEF DESCRIPTION

An encapsulation structure is provided in accordance with one embodiment of the invention. The encapsulation structure comprises a first barrier layer, and an electroluminescence device configured to be coupled to the first barrier layer, and comprising a substrate and an electroluminescence element both defining a lateral side. The electroluminescence element comprises a first electrode disposed on the substrate, a second electrode, and an organic light-emitting layer disposed between the first and second electrodes. Further, the encapsulation structure comprises a second barrier layer configured to be coupled to the electroluminescence device, and an adhesive configured to locate between and connect the first and second barrier layers, and at least to be coupled to the lateral side of the electroluminescence device to seal the electroluminescence device between the first and second barrier layers.

Another embodiment of the invention further provides an encapsulation method. The method comprises providing a first barrier layer, disposing a first adhesive on the first barrier layer, disposing an electroluminescence device on the first barrier layer disposed with the first adhesive, providing a second barrier layer, disposing a second adhesive on the second barrier layer, and assembling the second barrier layer disposed with the second adhesive onto the first barrier layer disposed with the first adhesive so that the first and second adhesives are coupled to each other, and one or more of the first and second adhesives are at least coupled to the lateral side of the electroluminescence device to seal the electroluminescence device between the first and second barrier layers. The electroluminescence device comprises a substrate and an electroluminescence element both defining a lateral side, and the electroluminescence element comprises a first electrode disposed on the substrate, a second electrode, and an organic light-emitting layer disposed between the first and second electrodes.

BRIEF DESCRIPTION OF THE DRAWINGS

The above and other aspects, features, and advantages of the present disclosure will become more apparent in light of the following detailed description when taken in conjunction with the accompanying drawings in which.

DETAILED DESCRIPTION OF THE DISCLOSURE

Embodiments of the present disclosure will be described hereinbelow with reference to the accompanying drawings. In the following description, well-known functions or constructions are not described in detail to avoid obscuring the disclosure in unnecessary detail.

Figure 1:
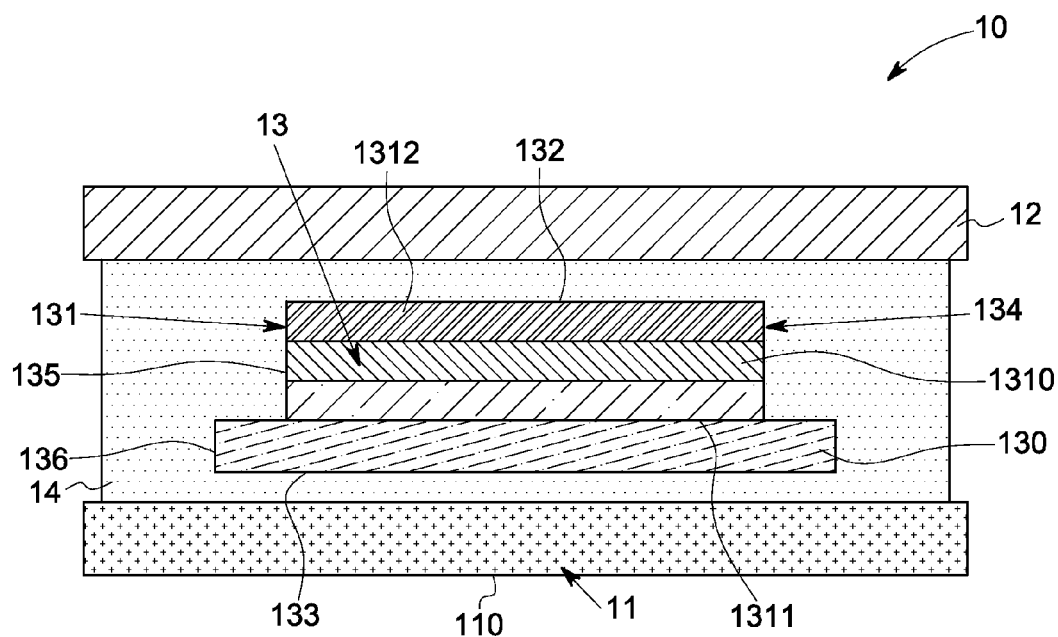
FIG. 1 is a schematic diagram of an encapsulation structure of an electroluminescence device in accordance with one embodiment of the invention.

FIG. 1 illustrates a schematic diagram of an encapsulation structure 10 of an electroluminescence device 13 in accordance with one embodiment of the invention. As illustrated in FIG. 1, the encapsulation structure 10 comprises a first barrier layer 11, a second barrier layer 12, the electroluminescence device 13, and an adhesive 14.

In the illustrated embodiment, the first barrier layer 11 comprises a barrier element 110. The electroluminescence device 13 is disposed between the barrier element 110 and the second barrier layer 12. The electroluminescence device 13 may comprise a substrate 130 and an electroluminescence element 131 disposed on the substrate 130. In non-limiting examples, the substrate 130 may comprise glass, metal foil, plastic or polymeric material. The plastic or polymeric materials may be useful for fabricating flexible devices. Such materials may comprise poly(ethylene terephthalate) (PET), poly(butylene terephthalate) (PBT), poly(enthylene naphthalate) (PEN), Polycarbonate (PC), polyimides (PI), polysulfones (PSO), poly(p-phenylene ether sulfone) (PES), polyethylene (PE), polypropylene (PP), poly(vinyl chloride) (PVC), polystyrene (PS) and poly(methyl methyleacrylate) (PMMA) etc. Additionally, other materials, which can serve as a substrate may also be employed.

In embodiments of the invention, the electroluminescence element 131 may be an "OLED" (organic light emitting diode) or a "PLED" (polymer light emitting diode), and may comprise an organic light-emitting layer 1310 disposed between two electrodes, e.g., a first electrode 1311 and a second electrode 1312. As known in the art, the organic light-emitting layer 1310 may comprise a single layer or two or more sublayers to cooperate with the first and second electrodes 1311 and 1312 to emit light. The first and second electrodes inject charge carriers, i.e., holes and electrons, into the organic light-emitting layer where they recombine to form excited molecules or excitons, which emit light when the molecules or excitons decay. The color of light emitted by the molecules depends on the energy difference between the excited state and the ground state of the molecules or excitons. In non-limiting examples, the organic light emitting layer may have a thickness of about 50-500 nanometers, and the electrodes each may have a thickness of about 100-1000 nanometers.

In some embodiments, the first electrode 1311 may serve as an anode, and the second electrode 1312 may serve as a cathode. In one embodiment, a protective material may be placed on the second electrode 1312, which is electrically insulating and provide mechanical protection to the second electrode 1312. Non-limiting examples of the protective material comprise organic including polymer adhesive layers comprising thermosets, such as epoxies or urethanes, and thermoplastics, such as olefins, amines, and acrylics. These materials can be applied by lamination or coating, and may be cured subsequently. In other examples, the material may include a second phase filler, either organic or inorganic such as silica. In the illustrated embodiment, the substrate 130 comprises a transparent PET. The anode 1311 comprises indium tin oxide (ITO) coated on the PET substrate 130, and the cathode 1312 comprises aluminum, which can be referred to as a bottom-emitting configuration. In other embodiments, the electroluminescence device 13 may be configured to a top-emitting configuration (not shown), which can be easily implemented by one skilled in the art, that is, the first electrode 1311 may serve as a cathode, and the second electrode 1312 may serve as an anode. Thus, depending on different applications, the substrate 130 and the first and second barrier layers 11, 12 may be opaque or transparent.

In embodiments of the invention, the cathode generally may comprise a material having a low work function value such that a relatively small voltage causes emission of electrons from the cathode. In some embodiments, besides the aluminum, the cathode may comprise calcium or a metal such as silver, magnesium, or a magnesium/silver alloy. Alternatively, the cathode may be made of two layers to enhance electron injection. Non-limiting examples of the cathode may comprise a thin inner layer of LiF followed by a thicker outer layer of aluminum, or a thin inner layer of calcium followed by a thicker outer layer of aluminum or silver.

The anode generally may comprise a material having a high work function value. In some embodiments, the anode may be transparent so that light generated in the organic light-emitting layer can propagate out of the luminescence device 10. In non-limiting examples, besides the ITO, the anode may comprise tin oxide, nickel, or gold, and may be formed by conventional vapor deposition techniques, such as evaporation or sputtering.

As illustrated in FIG. 1, in one non-limiting example, the first barrier layer 11 and the second barrier layer 12 may be disposed parallel to each other. The adhesive 14 may be located between and connect the first barrier layer 11 and the second barrier layer 12 to seal the electroluminescence device 13. In embodiments of the invention, the electroluminescence device 13 comprises an upper surface 132, a bottom surface 133 opposite to the upper surface 132, and a lateral side 134 located between the upper surface 132 and the bottom surface 133. In the illustrated embodiment, the lateral side 134 comprises a first lateral side 135 of the electroluminescence element 131 and a second lateral side 136 of the substrate 130. In non-limiting examples, the adhesive 14 may be at least coupled to one or more of the first and second lateral sides 135 and 136 with desired width(s) to seal the lateral side 135 and/or the lateral side 136. In one example, the adhesive 14 may be disposed between the upper surface 132 and the second barrier layer 12, between the bottom surface 133 and the first barrier layer 11, and on both the first and second lateral sides 135 and 136, such that the electroluminescence device 13 is buried into the adhesive 14. Various techniques, such as dispensing, screen-printing and contact printing, may be used to apply the adhesive 14.

In embodiments of the invention, the adhesive 14 may be thermoplastic or thermosetting, and may be thin, for example, about or less than 50 ums, about or less than 25 microns (um), or as thin as 12 microns (um) or even less. Thus, the geometry of the encapsulation structure may create a long lateral path for preventing moisture and/or oxygen from reaching the lateral side 134. In one non-limiting example, assuming a thickness of the adhesive 14 may be 50 um, and the seal width on the first or second lateral side may be 10 mm. As can be seen, the ratio of the width and the thickness is large so that the lateral path for moisture ingress may be difficult. Depending on different requirements, the dimensions of the encapsulation structure may be altered accordingly.

The adhesive 14 may be selected for low cost, easy processing in large areas as well as transparency, low moisture permeability, and good adhesion, and may have capacities to absorb moisture and/or oxygen to prevent moisture and/or oxygen from reaching the OLED device 13. In non-limiting examples, the adhesive 14 may comprise a polymeric material, such as epoxy, acrylic urethane, silicone, rubber, vinyl, or polyolefin. In the illustrated embodiment, the adhesive 14 comprises a first adhesive 140 and a second adhesive 141 (shown in FIG. 5). Additionally, in certain embodiments, desiccant materials (not shown) may be dispensed into the adhesive 14.

In embodiments of the invention, the barrier element 110 and the second barrier layer 12 may be configured to prevent the diffusion of moisture and oxygen into the region of the electroluminescence element 131. In non-limiting examples, the barrier element 110 and the second barrier layer 12 may comprise material such as organic material, inorganic material, or metal foils. Organic material may comprise carbon, hydrogen, oxygen, sulfur, nitrogen, and/or silicon, etc. The inorganic material may comprise oxide, nitride, carbide, boride, oxynitride, oxycarbide, or combinations thereof. And the metal foils may comprise aluminum (Al), silver (Ag) or chromium (Cr), etc.

Alternatively, the barrier element 110 and the second barrier layer 12 may comprise hybrid organic/inorganic material, etc. The organic materials may comprise acrylates, epoxies, epoxyamines, xylenes, siloxanes, silicones, etc. In one example, the barrier element 110 may comprise glass, plastic or polymeric material, similar to the material of the substrate 130, such as PET, PBT, PEN, PC, PI, PSO, PES, PE, PP, PVC, PS, and PMMA etc. The second barrier layer 12 may comprise the reflective material, such as Al, Ag or Cr etc. In other examples, the second barrier layer 12 may comprise a material having a coating of the reflective material, for example, a metal may be coated on glass, plastic or polymeric material. The second barrier layer 12 with the reflective coating may be implemented to reflect any radiation emitted away from the substantially transparent flexible substrate 130 and direct such radiation toward the flexible substrate 130 such that the total amount of radiation emitted in this direction is increased. In certain embodiments, the second barrier layer 12 may advantageously include a material to prevent diffusion of reactive environmental elements, such as oxygen and moisture, into the electroluminescence element 131. In the illustrated embodiment, the barrier element 110 is flexible and comprises PET, and the second barrier layer 12 comprises the reflective aluminum foil.

Figure 2:
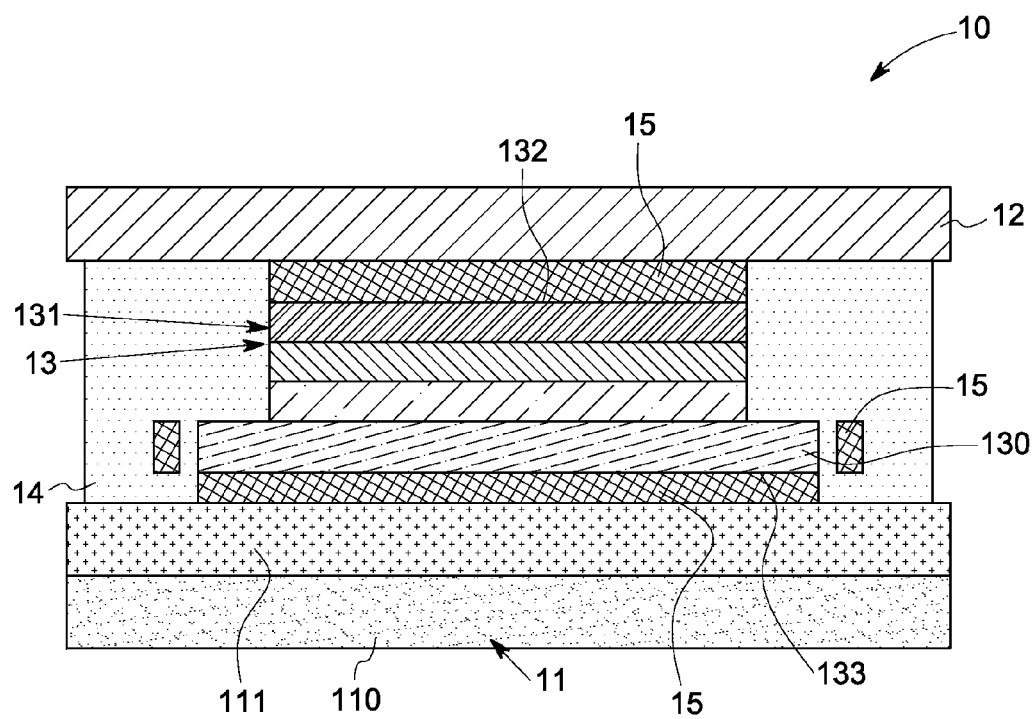
FIG. 2 is a schematic diagram of the encapsulation structure of the electroluminescence device in accordance with another embodiment of the invention.

FIG. 2 illustrates a schematic diagram of the encapsulation structure 10 of the electroluminescence device 13 in accordance with another embodiment of the invention. As illustrated in FIG. 2, in order to improve the capacity of absorbing moisture and/or oxygen, the first barrier layer 11 may further comprise a coating 111 coated on the barrier element 110. Same numerals in FIGS. 1-2 may indicate similar elements.

In certain embodiments, the coating 111 may comprise a graded ultra-high barrier (UHB) coating. Compositions of the UHB coating 111 across a thickness thereof may be an organic, inorganic, or ceramic material. Varying the relative supply rates or changing identities of reacting species can result in the UHB coating that has a graded composition across its thickness. The organic coating material may comprise carbon, hydrogen, oxygen, and optionally other minor elements, such as sulfur, nitrogen, silicon, etc., depending on types of reactants. Suitable reactants that result in organic compositions in the coating are straight or branched alkanes, alkenes, alkynes, alcohols, aldehydes, ethers, alkylene oxides, aromatics, etc., having up to 15 carbon atoms. The inorganic and ceramic coating materials may comprise oxide, nitride, carbide, boride, or combinations thereof of elements of Groups IIA, IIIA, IVA, VA, VIA, VIIA, IB, and IIB; metals of Groups IIIB, IVB, and VB, and rare-earth metals.

For example, silicon carbide may be deposited onto the barrier element 110 by recombination of plasmas generated from silane ($SiH_4$) and an organic material, such as methane or xylene. Silicon oxycarbide may be deposited from plasmas generated from silane, methane, and oxygen or silane and propylene oxide. Alternatively, silicon oxycarbide may also be deposited from plasmas generated from organosilicone precursors, such as tetraethoxysilane (TEOS), hexamethyldisiloxane (HMDSO), hexamethyldisilazane (HMDSN), or octamethylcyclotetrasiloxane (D4). Additionally, silicon nitride may be deposited from plasmas generated from silane and ammonia. Aluminum oxycarbonitride may be deposited from a plasma generated from a mixture of aluminum nitrate and ammonia. Other combinations of reactants may be chosen to obtain a desired coating composition. The choice of the particular reactants is within the skills of the artisans.

In certain embodiments, the UHB coating 111 may be formed by one of many deposition techniques, such as plasma-enhanced chemical-vapor deposition ("PECVD"), radio-frequency plasma-enhanced chemical-vapor deposition ("RFPECVD"), expanding thermal-plasma chemical-vapor deposition ("ETPCVD"), sputtering including reactive sputtering, electron-cyclotron-resonance plasma-enhanced chemical-vapor deposition ("ECRPECVD"), inductively coupled plasma-enhanced chemical-vapor deposition ("ICPECVD"), or combinations thereof. Other discussion of the UHB coating 111 is disclosed in U.S. Pat. No. 7,015,640, which is incorporated herein by reference.

In embodiments of the invention, the encapsulation structure 10 may further comprises a "getter" material disposed between the first and second barrier layers 11 and 12 to absorb moisture and/or oxygen. As illustrated in FIG. 2, a getter material 15 is disposed between the bottom surface 133 and the first barrier layer 11, and around the lateral side 134. Additionally, the getter material 15 may also be disposed between the upper surface 132 and the second barrier layer 12. In one embodiment, the getter material 15 may be a getter layer coated on the first and/or second barrier layers, and disposed around the lateral side 134. Alternatively, the getter material 15 may be coated on the upper surface 132 and/or the bottom surface 131. In certain embodiments, the getter material 15 may be in a form of particles dispensed in the adhesive 14. The getter material 15 and the adhesive 14 may or may not be disposed between the bottom surface 133 and the first barrier layer 11, and/or the upper surface 132 and the second barrier layer 12 simultaneously. Thus, the getter material 15 may be disposed at different positions and with different amounts.

In certain embodiments, the getter material 15 may be transparent and selected from material, such as certain alkaline earth metal oxides, but are not limited to BaO, SrO, CaO and MgO. Additionally, the getter material may be selected from various metallic elements such as Ti, Mg, Ba, and Ca. Other discussion of the getter material 15 can be found in U.S. Pat. No. 6,465,953, which is incorporated herein by reference. In addition, material may be employed that can absorb larger amounts of water at least temporarily or can efficiently transport moisture laterally towards getter material at the periphery.

Figure 3:
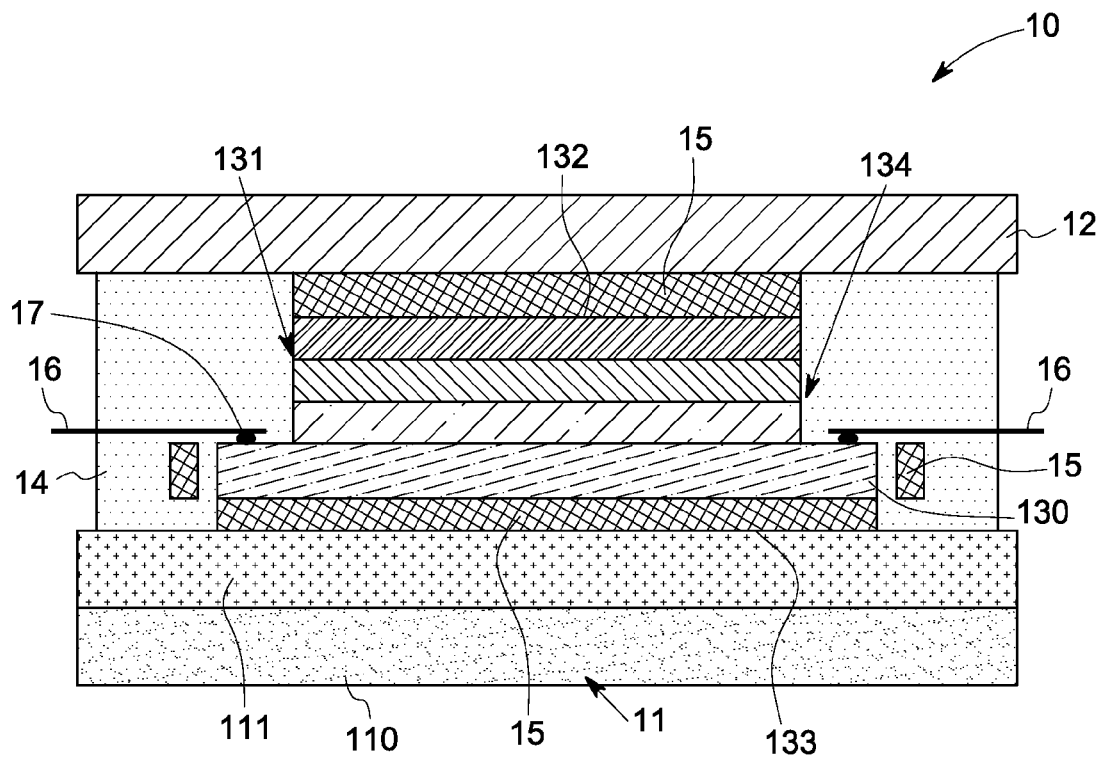
FIG. 3 is a schematic diagram useful in explaining an interconnect of conductive tabs and the electroluminescence device in accordance with one embodiment of the invention.
Figure 4:
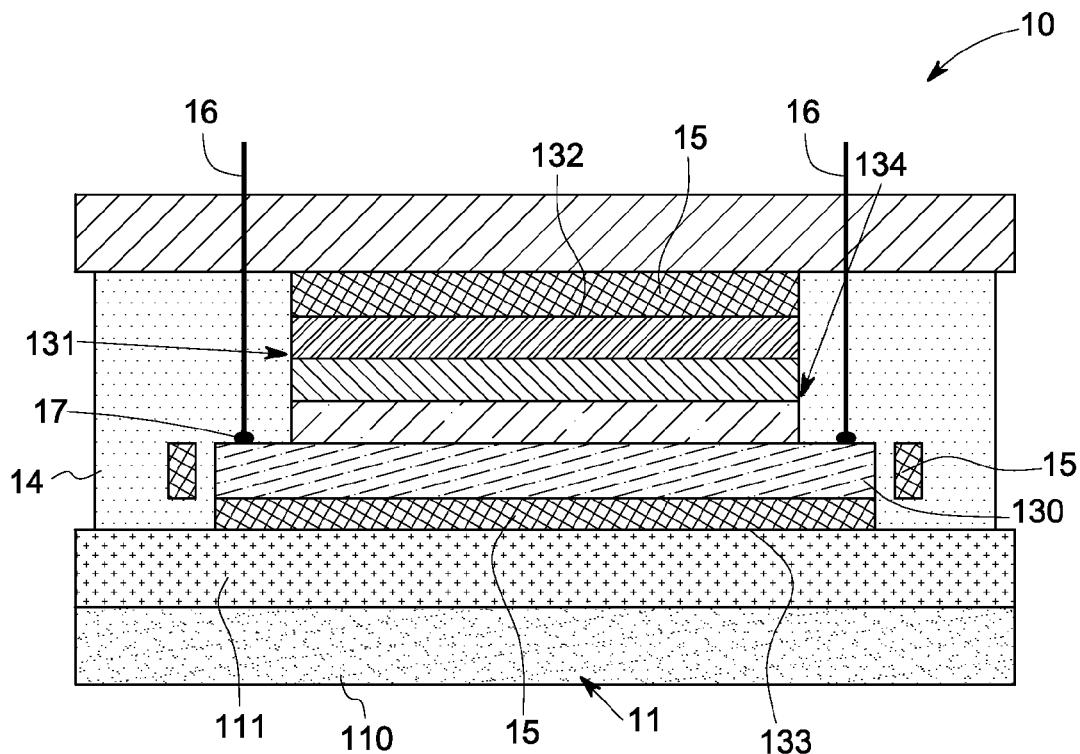
FIG. 4 is a schematic diagram useful in explaining an interconnect of the conductive taps and the electroluminescence device in accordance with another embodiment of the invention.

In embodiments of the invention, the encapsulation structure 10 may employ conductive tabs to augment conductivity of the electrodes (not labeled) when an electrical current is applied to the electroluminescence element 131. In one embodiment, as illustrated in FIG. 3, conductive tabs 16 pass through the adhesive 14 horizontally to connect to the electrodes. Alternatively, as illustrated in FIG. 4, the second barrier layer 12 has pre-punched holes (not labeled) so that the conductive tabs 16 pass through the second barrier layer 12 and the adhesive 14 vertically to electrically connect to the electrodes. The conductive tabs 16 may comprise electrically conductive metals or metal alloys. In one example, the conductive tabs 16 may comprise copper. Additionally, the conductive tabs 16 may be coated with insulating layers (not shown).

As illustrated in FIGS. 3-4, in certain embodiments, a conductive adhesive 17 may be employed to electrically connect the conductive tabs 16 and the respective electrodes. In one example, the conductive adhesive 17 may be first coated on the conductive tabs 16 to connect to the electrodes. Alternatively, the conductive adhesive 17 may be first coated on the respective electrodes, and then, the conductive tabs 16 are placed on the conductive adhesive 17. In some embodiments, the conductive adhesive 17 may be an acrylic or an epoxy or other organic adhesive with conductive particle fillers, which can be easily implemented by one skilled in the art.

Figure 5:
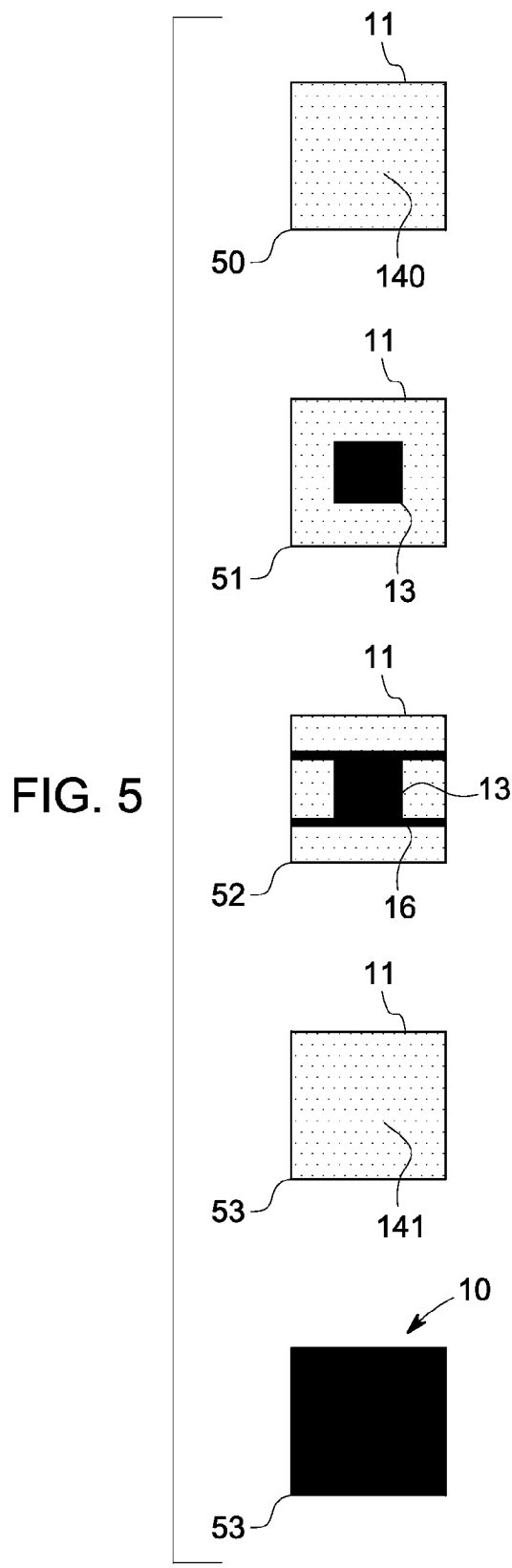
FIG. 5 is a schematic diagram of a process for encapsulating the electroluminescence device in accordance with one embodiment of the invention.

FIG. 5 illustrates a schematic diagram of a process for encapsulating the electroluminescence device 13 in accordance with one embodiment of the invention. As illustrated in FIG. 5, to a single electroluminescence device, in step 50, the first barrier layer 11 is fabricated and the first adhesive 140 of the adhesive 14 is coated on the first barrier layer 11 with a desired configuration for sealing the electroluminescence device 13. In some embodiments, the entire first barrier layer 11 may be coated, or a desired area on the first barrier layer 11 may not be coated, which would be coupled to the bottom surface 133 (show in FIGS. 1-4). In non-limiting examples, as described above, the first barrier layer 11 may comprise the PET or PET coated with the UHB coating 111 (show in FIGS. 2-4). In step 51, the prepared electroluminescence device 13 is disposed on the first coated barrier layer 11. In embodiments of the invention, the method for fabricating the electroluminescence device 13 is known to one skilled in the art.

In step 52, the conductive tabs 16 are placed on the respective electrodes horizontally, and the conductive adhesive 17 (shown in FIGS. 3-4) may be disposed between the conductive tabs 16 and the respective electrodes. Alternatively, as illustrated in FIG. 4, the conductive tabs 16 may be disposed vertically to connect to the respective electrodes. Additionally, the conductive tabs 16 may be coated with insulating layers. In some examples, the step of placing the conductive tabs 16 may not be employed. In step 53, the second barrier layer 12 is provided, and the second adhesive 141 of the adhesive 14 is coated on the second barrier layer 12 for cooperating with the first adhesive 140. Similar to the first barrier layer 11, the entire second barrier layer 12 may be coated, or a desired area on the second barrier layer 12 may not be coated, which would be coupled to the upper surface 132.

In step 54, the coated second barrier layer 12 is assembled onto the first coated barrier layer 11. Thus, as illustrated in FIGS. 1-4, the first and second adhesives 140 and 141 are coupled to each other so that the adhesive 14 is coupled to at least one or more of first and second lateral sides 135 and 136 (shown in FIG. 1) to seal the electroluminescence device 13 between the first and second barrier layers 11 and 12. In certain embodiments, the adhesive 14 may be cured by UV radiation or heat. Other curing techniques, such as e-beam, laser, or heat can be used. The curing techniques and conditions may depend on the type of the adhesive used. Additionally, the first and second adhesives 140 and 141 may be the same or different.

In other examples, prior to placing the electroluminescence device 13 on the first coated barrier layer 11, the getter material 15 (shown in FIGS. 2-4) may be first coated on the desired area(s) with/without the adhesive. Alternatively, the getter material 15 may be first coated on the bottom surface 133, and/or the upper surface 132. Additionally, prior to assembling the second coated barrier layer 12 onto the first coated barrier layer 11, the getter material 15 may be first disposed around the lateral side 134 of the electroluminescence device 13. In one example, the getter material 15 may be in a form of particles to be dispensed in the first adhesive 140 and/or the second adhesive 141 prior to assembling the barrier layers 11 and 12.

During encapsulation, in other embodiments, the first and second adhesives 140 and 141 may be freestanding films to be positioned between the first and second barrier layers 11 and 12. Alternatively, the first and second adhesives 140 and 141 may be first coated on the electroluminescence device 13. Thus, the step of coating the adhesive 14 on the respective barrier layers 11 and 12 may not be employed. At this time, the getter material 15 may be coated on the first and/or second barrier layers, or also coated on the bottom surface 133 and/or the upper surface 132 each with/without the respective adhesives.

In embodiments of the invention, the fabrication of electroluminescence device 13 and the encapsulation process may be performing in parallel so that the encapsulation efficiency may be improved. In one example, as known in the art, an electroluminescence device (not shown) with a large size may be fabricated on a roll-to-roll process. Then, the large electroluminescence device may be divided into a batch of single electroluminescence devices 13. Thus, similar to the encapsulation process described above, the batch of the electroluminescence devices 13 may be packaged simultaneously between large first and second barrier layers. If need, the large package structure may be cut into a batch of single package structures, such as the encapsulation structure of the electroluminescence device 13. Additionally, when coated on the first barrier layer 11, the UHB coating 111 may not be exposed to the roll-to-roll process for fabricating the electroluminescence device so that the quality of the UHB coating 111 may be ensured.

The effectiveness of a package for protecting an electroluminescent device from moisture can be determined by evaluating ingress through the package during temperature and humidity testing. As a specific example, conditions of 60° C. and 90% relative humidity can be used to accelerate degradation relative to room temperature testing. The package herein described has been shown to survive 2500 hours of testing under these conditions without significant damaging ingress of moisture. Thus, the package is effective for preventing ingress of moisture and/or oxygen through the edges and through the barrier layers.

While the disclosure has been illustrated and described in typical embodiments, it is not intended to be limited to the details shown, since various modifications and substitutions can be made without departing in any way from the spirit of the present disclosure. As such, further modifications and equivalents of the disclosure herein disclosed may occur to persons skilled in the art using no more than routine experimentation, and all such modifications and equivalents are believed to be within the spirit and scope of the disclosure as defined by the following claims.

What is claimed is:

1. An encapsulation structure, comprising:
   a first barrier layer;
   an electroluminescence device configured to be coupled to the first barrier layer, and comprising a substrate and an electroluminescence element both defining a lateral side, and the electroluminescence element comprising a first electrode disposed on the substrate, a second electrode, and an organic light-emitting layer disposed between the first and second electrodes;
   a second barrier layer configured to be coupled to the electroluminescence device; and
   an adhesive disposed directly on and connecting the first and second barrier layers, contiguous to the lateral side of the electroluminescence device to seal the electroluminescence device between the first and second barrier layers.

2. The encapsulation structure of claim 1, wherein the first and second barrier layers are disposed parallel to each other.

3. The encapsulation structure of claim 1, wherein the lateral side comprises a first lateral side on the electroluminescence element and a second lateral side on the substrate, and wherein the adhesive is coupled to both the first and second lateral sides.

4. The encapsulation structure of claim 1, wherein the adhesive further locates at one or more positions of between the first barrier layer and the electroluminescence device, and between the second barrier layer and the electroluminescence device.

5. The encapsulation structure of claim 1, wherein the adhesive comprises a first adhesive coupled to the first barrier layer, and a second transparent adhesive coupled to the second barrier layer.

6. The encapsulation structure of claim 1, wherein the first barrier layer comprises a barrier element, and wherein the barrier element and the second barrier layer comprise one of a flexible plastic, a metal foil, or a flexible glass, respectively.

7. The encapsulation structure of claim 6, wherein the second barrier layer comprises an aluminum foil.

8. The encapsulation structure of claim 6, wherein the barrier element comprises polyethyleneterephthalate (PET).

9. The encapsulation structure of claim 6, wherein the first barrier further comprises a graded ultra-high barrier coating coated on the barrier element.

10. The encapsulation structure of claim 1, further comprising a getter material configured to be located at one or more positions of between the first barrier layer and the electroluminescence device, between the second barrier layer and the electroluminescence device, and around the electroluminescence device.

11. The encapsulation structure of claim 1, wherein the substrate comprises PET, the first electrode comprises an ITO anode, and the second electrode comprises an aluminum cathode.

12. The encapsulation structure of claim 1, further comprising a protective material placed on and mechanically protecting the second electrode.

13. The encapsulation structure of claim 1, further comprising conductive tabs configured to connect to the respective electrodes.

14. The encapsulation structure of claim 13, wherein the conductive tabs are configured to horizontally connect to the respective electrodes.

15. The encapsulation structure of claim 13, wherein the conductive tabs are configured to vertically connected to the respective electrodes.

* * * * *